(12) United States Patent
Hong et al.

(10) Patent No.: US 7,658,858 B2
(45) Date of Patent: Feb. 9, 2010

(54) BAND FILTER USING FILM BULK ACOUSTIC RESONATOR AND METHOD OF FABRICATING THE SAME

(75) Inventors: Seog-woo Hong, Yongin-si (KR); Byeong-ju Ha, Seongnam-si (KR); In-sang Song, Seoul (KR); Kyu-sik Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 306 days.

(21) Appl. No.: 11/337,574

(22) Filed: Jan. 24, 2006

(65) Prior Publication Data

US 2006/0164187 A1    Jul. 27, 2006

(30) Foreign Application Priority Data

Jan. 25, 2005  (KR) .................. 10-2005-0006771

(51) Int. Cl.
   *H01B 13/00*  (2006.01)
(52) U.S. Cl. .................. 216/17; 216/22; 216/47; 438/53
(58) Field of Classification Search .......... 438/53, 438/27, 48; 216/12, 19, 47, 65, 17, 41
   See application file for complete search history.

(56) References Cited

U.S. PATENT DOCUMENTS 5,853,601 A * 12/1998 Krishaswamy et al. ......... 216/2

6,635,185 B2 * 10/2003 Demmin et al. .............. 216/64
6,673,697 B2 *  1/2004 Ma et al. ..................... 438/455

(Continued)

FOREIGN PATENT DOCUMENTS

EP         1 170 862 A2     1/2002

(Continued)

OTHER PUBLICATIONS

PT Docker, P. Kinnell, MCL Ward; A Dry Single-Step Process for the Manufacture of Released MEMS Structures; Journal of Micromechanics & Microengineering, vol. 13, No. 5; Institute of Physics Publishing; Jul. 9, 2003; pp. 790-794; IOP Publishing Ltd.; United Kingdom.

(Continued)

*Primary Examiner*—Lan Vinh
(74) *Attorney, Agent, or Firm*—Sughrue Mion, PLLC (57) ABSTRACT

A band filter using a film bulk acoustic resonator and a method of fabricating the same. The method includes the steps of forming a membrane layer on a substrate, forming a plurality of resonators on an upper surface of the membrane layer, depositing a mask layer on a lower surface of the membrane layer and patterning the mask layer to form a plurality of main windows and sub windows, and forming cavities along the main windows in the substrate and forming sub walls in the cavities in such a way that the sub walls are separated apart from the membrane layer by using the notch effect caused during a dry etching. It is possible to precisely form cavities with desired sizes even if the cavities have different sizes, to reduce the notched areas in the cavities, to reduce the total size of the filter by decreasing a distance between the cavities and to reduce the total length of wires.

12 Claims, 7 Drawing Sheets

U.S. PATENT DOCUMENTS

| | | | |
|---|---|---|---|
| 6,944,931 B2* | 9/2005 | Shcheglov et al. | 29/595 |
| 2002/0057176 A1* | 5/2002 | Norstrom et al. | 336/200 |
| 2002/0158270 A1* | 10/2002 | Yamamoto et al. | 257/200 |
| 2004/0185594 A1* | 9/2004 | Nishihara et al. | 438/53 |

FOREIGN PATENT DOCUMENTS

| | | |
|---|---|---|
| EP | 1 170 862 A3 | 1/2002 |
| EP | 1 306 973 A2 | 5/2003 |
| EP | 1 598 933 A1 | 11/2005 |
| EP | 1 306 973 A3 | 6/2006 |

OTHER PUBLICATIONS

T. Nishihara, T. Yokoyama, T Miyashita, Y Satoh; High Performance and Miniature Thin Film Bulk Acoustic Wave Filters for 5 GHz; 2002 IEEE Ultrasonics Symposium; Oct. 2002; pp. 969-972.

SV Krishnaswamy; J Rosenbaum; S Horwitz; C Vale; R A Moore; Film Bulk Acoustic Wave Resonator Technology; 1990 IEEE Ultrasonics Symposium; Dec. 4, 1990; pp. 529-536.

Ivo W. Rangelow; Critical Tasks in High Aspect Ratio Silicon Dry Etching for Microelectromechanical Systems; Journal of Vacuum Science and Technology A. Vacuum, Surfaces and Films AIP; vol. 21 No. 4; Jul. 2003; pp. 1550-1562.

A.A. Ayon, K Ishihara, R.A. Braff, H.H. Sawin, M.A. Schmidt; Microfabrication and Testing of Suspended Structures Compatible with Silicon-on-Insulator Technology; Journal of Vacuum Science and Technology B. Microelectronics Processing and Phenomena; vol. 17, No. 4; Jul. 1999; pp. 1589-1593.

* cited by examiner

BAND FILTER USING FILM BULK ACOUSTIC RESONATOR AND METHOD OF FABRICATING THE SAME

CROSS-REFERENCE TO RELATED APPLICATIONS.

This application claims priority from Korean Patent Application No. 10-2005-0006771, filed on Jan. 25, 2005, the entire content of which is incorporated herein by reference.

BACKGROUND OF THE INVENTION

1. Field of the Invention

Apparatuses and methods consistent with the present invention relate to a band filter using a film bulk acoustic resonator and a method of fabricating the same, and more particularly to a band filter using a film bulk acoustic resonator in which a structure of a cavity for vibrating a thin film is modified and a method of fabricating the same.

2. Description of the Related Art

Generally, a film bulk acoustic resonator (FBAR) is a filter using a bulk acoustic wave of a piezoelectric layer. A size of a general frequency filter is proportional to a wavelength of an electromagnetic wave in a usage frequency band. Therefore, the size of a general frequency filter using the electromagnetic wave is relatively large. For example, when the frequency of the electromagnetic wave is 1 GHz, the size of a general frequency filter is approximately 30 cm, and when the frequency of the electromagnetic wave is 300 GHZ, the size of a general frequency filter is approximately 1 mm. However, if the bulk acoustic wave of, the piezoelectric layer is used, a wavelength of the bulk acoustic wave becomes less as a fraction (1/10,000) of a wavelength of the electromagnetic wave. According to this, the electromagnetic wave is converted into the bulk acoustic wave by the piezoelectric layer, and the size of the filter becomes less in proportion to the wavelength of the bulk acoustic wave. That is, since the size of the frequency filter using the bulk acoustic wave is approximately several hundred microns, and a plurality of the frequency filters using the bulk acoustic wave can be fabricated at one time by using a wafer, mass production of a band filter is possible.

Figure 1:
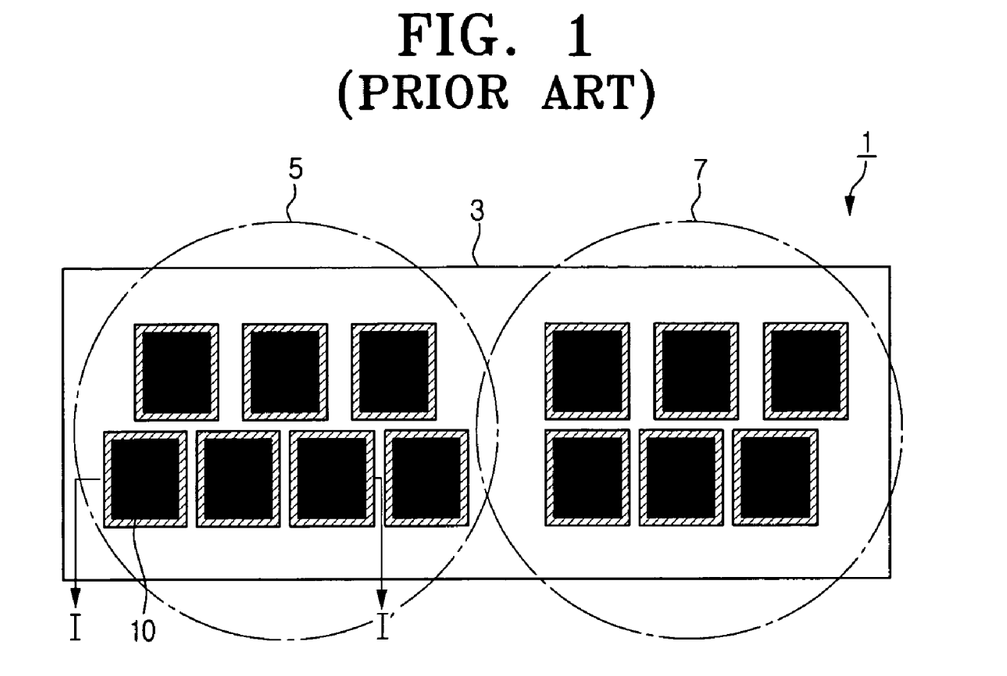
FIG. 1 is a schematic plane view of a duplexer filter with a film bulk acoustic resonator in accordance with a related art.

FIG. 1 is a schematic plane view showing a duplexer filter with a film bulk acoustic resonator in accordance with a related art.

Referring to FIG. 1, a duplexer filter 1 includes a substrate 3, a transmission-side film bulk acoustic filter 5 and a reception-side film bulk acoustic filter 7, formed on the substrate 3.

The transmission-side film bulk acoustic filter 5 and the reception-side film bulk acoustic filter 7 are constituted by film bulk acoustic resonators 10 formed on the substrate 3 and connected in series or parallel.

Figure 2:
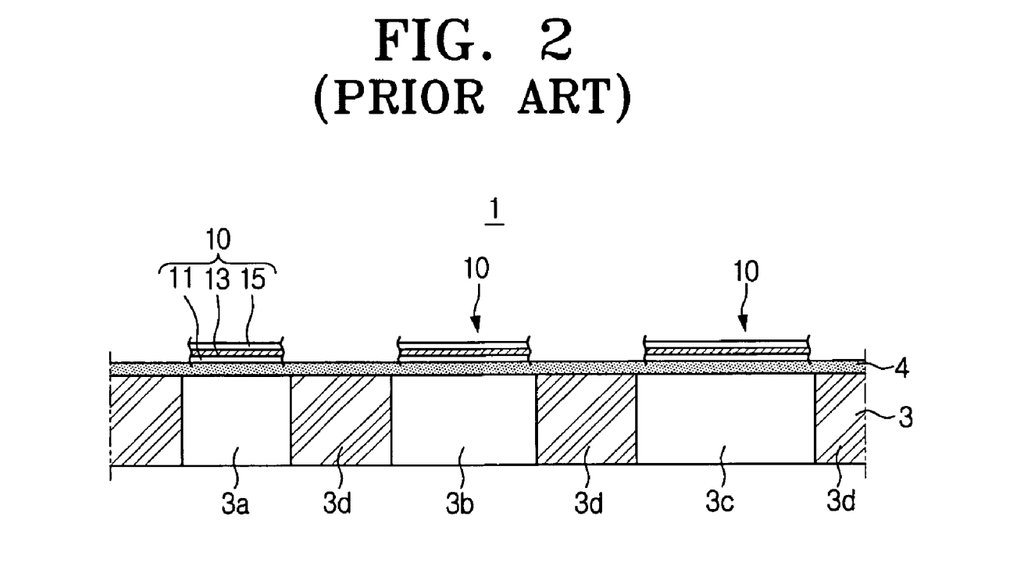
FIG. 2 is a cross-sectional view showing the filter in accordance with the related art, taken along the line I-I shown in FIG. 1.

FIG. 2 is a cross-sectional view showing a filter with cavities of different sizes, taken along line I-I' shown in FIG. 1.

Referring to FIG. 2, a plurality of cavities 3a, 3b and 3c with different sizes are formed on a substrate 3 and a membrane layer 4 is applied over the substrate 3 to cover the cavities 3a, 3b and 3c. Resonators 10 are formed on the membrane layer 4 at positions corresponding to the cavities 3a, 3b and 3c. A first electrode 11, a piezoelectric layer 13 and a second electrode 15 stacked sequentially constitutes a resonator 10.

A method of manufacturing the filter described above is explained briefly below.

Figure 3A:
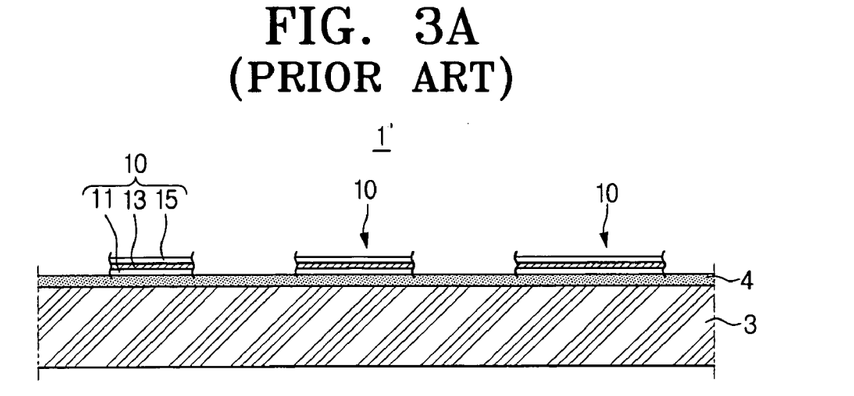
FIG. 3A to FIG. 3C illustrate a method of fabricating a duplexer filter with a film bulk acoustic resonator in accordance with the related art.
Figure 3B:
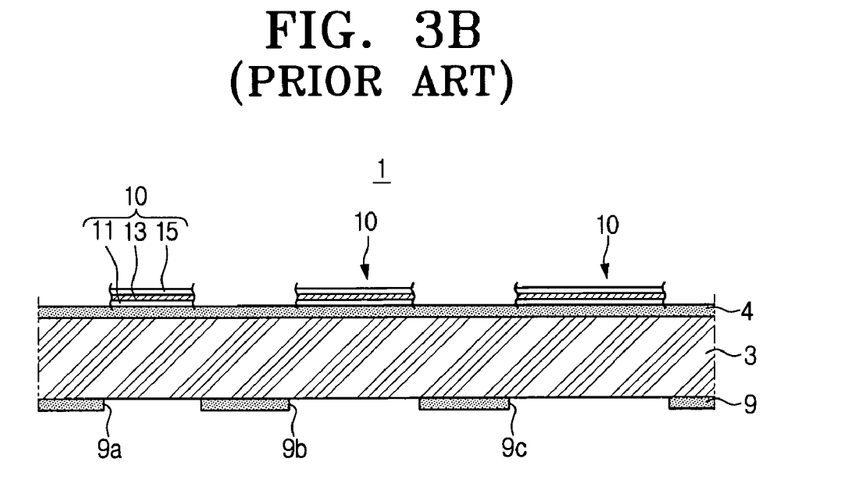
Figure 3C:
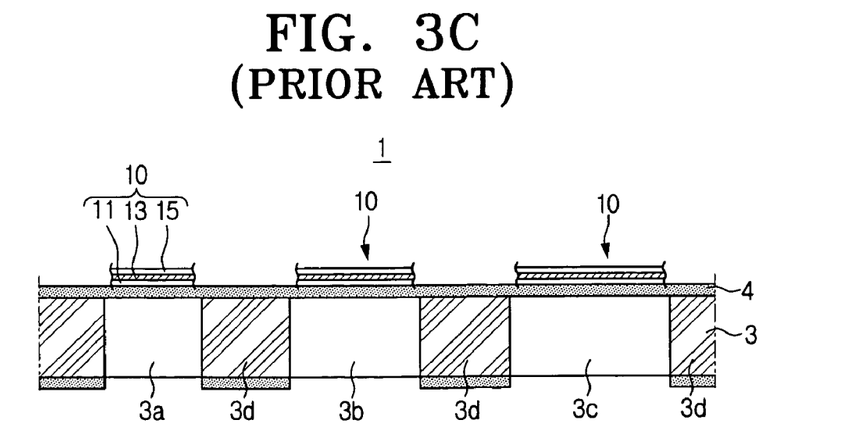
Figure 4A:
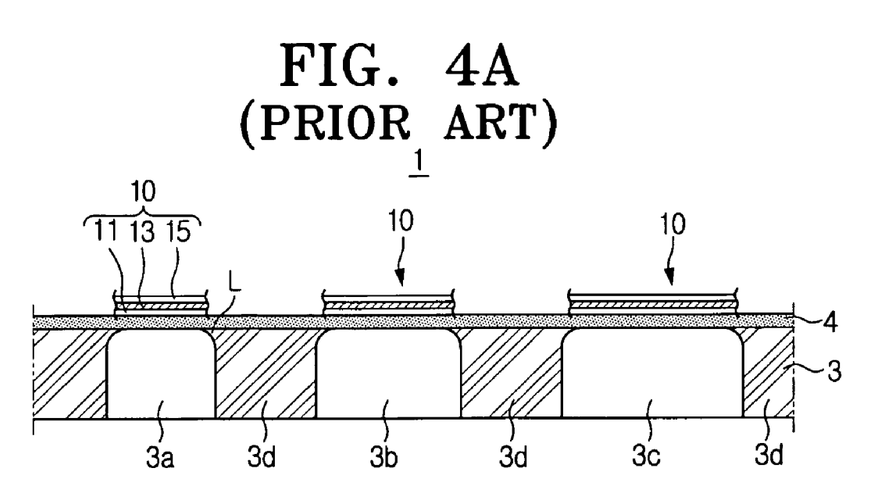
FIG. 4A is a view for explaining a loading effect caused upon dry etching in accordance with the related art.
Figure 4B:
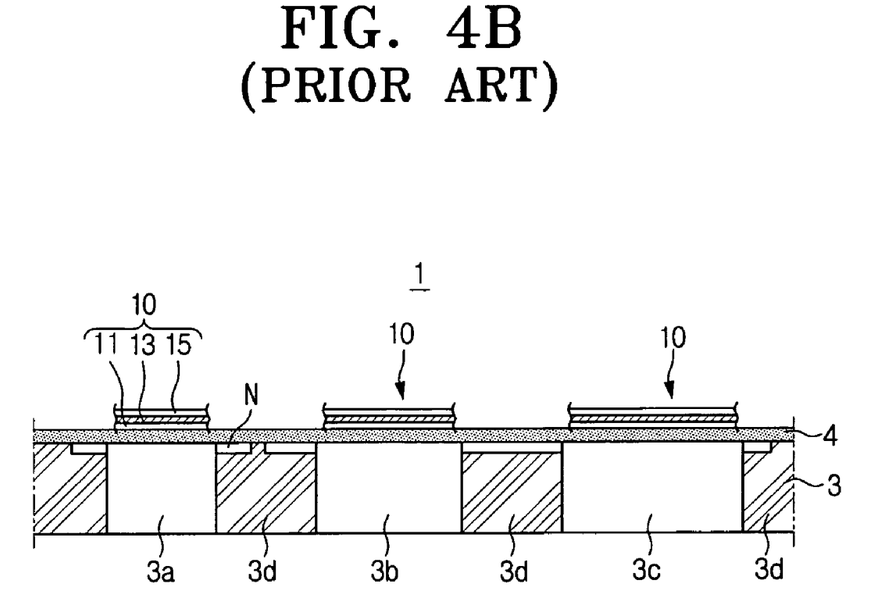
FIG. 4B is a view for explaining a notch effect caused upon drying etching in accordance with the related art.

FIG. 3A to FIG. 3C illustrate a method of fabricating a duplexer filter with film bulk acoustic resonators and FIGS. 4A and 4B are views for explaining the loading effect and the notches generated upon dry etching in accordance with the related art.

Referring to FIG. 3A, a membrane layer 4 is deposited on a substrate 3 and resonators 10 are created on the membrane layer 4.

Referring to FIG. 3B, a mask layer 9 is formed on the opposite surface of the substrate 3 with respect to the membrane layer 4 and patterned to produce windows 9a, 9b and 9c at positions where cavities 3a, 3b and 3c would be formed.

Referring to FIG. 3C, the substrate 3 is etched through the widows 9a, 9b and 9c using an inductively coupled plasma (ICP) etching equipment so that the cavities 3a, 3b and 3c are formed in the substrate 3, leaving walls 3d every between of the cavities 3a, 3b and 3c.

However, in accordance with the related art described above, in case of simultaneously etching the substrate 3 to form the cavities 3a, 3b and 3c with different sizes using the ICP etching equipment, it is difficult to precisely produce the cavities 3a, 3b and 3c with desired sizes due to a loading effect and a lag effect.

The loading effect means that edge portions of the cavities 3a, 3b and 3c, denoted by alphabetical reference "L" in FIG. 4A remain not being etched due to relatively low etch rate at the edge portions of the cavities 3a, 3b and 3c compared to the etch rate of the center portions of the cavities 3a, 3b and 3c.

The lag effect is generated because etch rates for every cavity 3a, 3b and 3c are different depending on the sizes of the cavities 3a, 3b and 3c. That is, etch rates in larger cavities are relatively higher than that in the small cavities. Accordingly, even if the etching is simultaneously performed under the same condition for every cavity 3a, 3b and 3c, the cavity 3c will be larger than the desired size after an etching process in a case where the size of the cavity 3c is larger than that of the others.

The notch effect means that the substrate 3 is over-etched at the bottom of the cavities, i.e. near the membrane layer 4, thereby forming notches in the walls 3d. The notch denoted by alphabetical reference "N" in FIG. 4B is created since ions generated during the etching process are bombarded to and reflected from the membrane layer 4 and the reflected ions etch the walls 3d by bombarding the walls 3d.

As described above, in a case where all the cavities 3a, 3b and 3c with different sizes are etched at the same time, it is difficult to form the cavities 3a, 3b and 3c with desired sizes due to the loading, lag and notch effects. Further, even the membrane layer 4 can be damaged due to a stress and walls 3d could be eliminated.

SUMMARY OF THE INVENTION

The present invention has been developed in order to solve the above and other problems associated with the related art. An aspect of the present invention is to provide a band filter using a film bulk acoustic resonator with cavities having desired precise sizes and with a physically strong structure. Another aspect of the present invention is to provide a method of fabricating such a band filter.

According to an aspect of the present invention, there is provided a band filter using a film bulk acoustic resonator, including: a substrate; a membrane layer formed on the substrate; a plurality of resonators formed on the membrane layer; a plurality of cavities formed in the substrate at positions corresponding to the resonators; and sub walls formed in the cavities in a net format, having a distance between the membrane layer and the top thereof.

According to another aspect of the present invention, there is provided a method of fabricating a band filter using a film bulk acoustic resonator, including the steps of: forming a membrane layer on a substrate; forming a plurality of resonators on an upper surface of the membrane layer; depositing a mask layer on a lower surface of the membrane layer and patterning the mask layer to form a plurality of main windows and sub windows; and forming cavities along the main windows in the substrate and forming sub walls in the cavities in such a way that the sub walls are separated apart from the membrane layer.

The sub windows may be rectangular, circular or corner-rounded rectangular.

The main windows may come in different sizes and the sub windows may be identical in their sizes.

The sub walls may be apart from the membrane layer by using the notch effect which is caused as ions generated during a dry etching process are reflected from the membrane layer and the reflected ions etch a portion of the sub walls.

The thickness of the sub walls may be determined depending on the amount of etching caused by the reflected ions so as for the sub walls to be separated from the membrane layer.

The membrane layer may be formed of a protective material which is not etched by the dry etching.

The membrane layer may be an oxide layer or a metal layer.

The substrate may be a silicon substrate.

The mask layer may be a photoresist layer or an oxide layer.

The oxide layer may be formed by a thermal oxidation process or a thin film deposition process.

The photoresist layer may be formed by a spin coasting process.

BRIEF DESCRIPTION OF THE DRAWINGS

The above and other aspects of the present invention will be more apparent by describing exemplary embodiments of the present invention with reference to the accompanying drawings, in which.

DETAILED DESCRIPTION OF THE EXEMPLARY EMBODIMENTS

Exemplary embodiments of the present invention will be described in greater detail with reference to the accompanying drawings.

Figure 5:
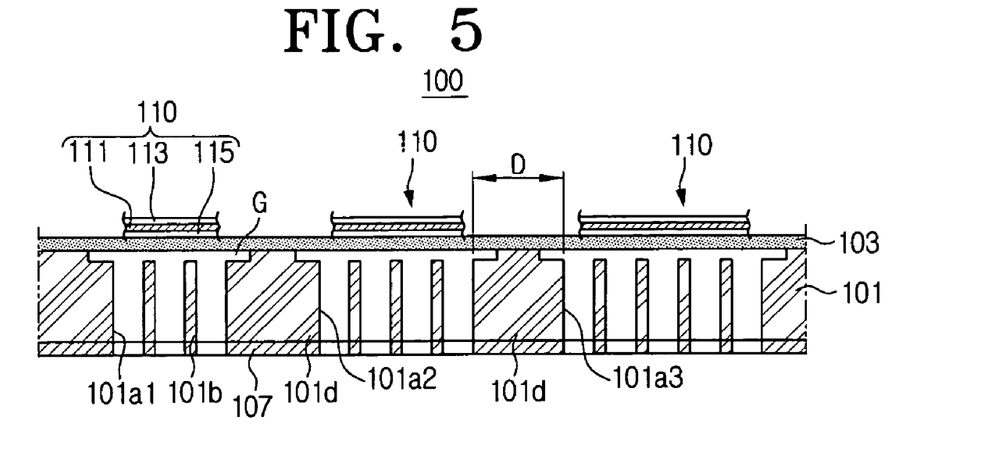
FIG. 5 is a cross-sectional view of a band filter using a film bulk resonator in accordance with an exemplary embodiment of the present invention.

FIG. 5 is a cross-sectional view showing a portion of a band filter using a film bulk acoustic resonator in accordance with an exemplary embodiment of the present invention.

Referring to FIG. 5, a band filter using a film bulk acoustic resonator 110 includes a substrate 101, a membrane layer 103 and a resonator 110.

The resonator 110 includes a piezoelectric layer 111 being vibrated by converting electrical signals to mechanical signals, an upper electrode 113 disposed on the piezoelectric layer 111 and a lower electrode 115 disposed under the piezoelectric layer 111.

The membrane layer 103 is a support layer for enabling the resonator 110 to vibrate and serves as an etching stop layer to define the depth of an etching for cavities $101_{a1}$, $101_{a2}$ and $101_{a3}$ upon etching to form the cavities $101_{a1}$, $101_{a2}$ and $101_{a3}$.

The cavities $101_{a1}$, $101_{a2}$ and $101_{a3}$ are formed in the substrate 101 provided with the resonators 110 at the positions corresponding to the resonators 110. The sizes of the cavities $101_{a1}$, $101_{a2}$ and $101_{a3}$ are determined to correspond to characteristics of the resonators 110, so that the sizes of the cavities $101_{a1}$, $101_{a2}$ and $101_{a3}$ are different.

Each of the cavities $101_{a1}$, $101_{a2}$ and $101_{a3}$ has sub walls $101_b$ formed in a net format. The top of the sub walls $101_b$ are apart from the membrane layer 103 by a distance to provide an air gap G between the membrane layer 103 and the sub walls $101_b$ to let the resonators 110 to vibrate therein. The sub walls $101_b$ can be apart from sidewalls, i.e. main walls, $101_d$ of the cavities $101_{a1}$, $101_{a2}$ and $101_{a3}$. The sub walls $101_b$ can serve as reinforcement members.

Next, a method of fabricating a band filter using a film bulk acoustic resonator will be described below.

Figure 6A:
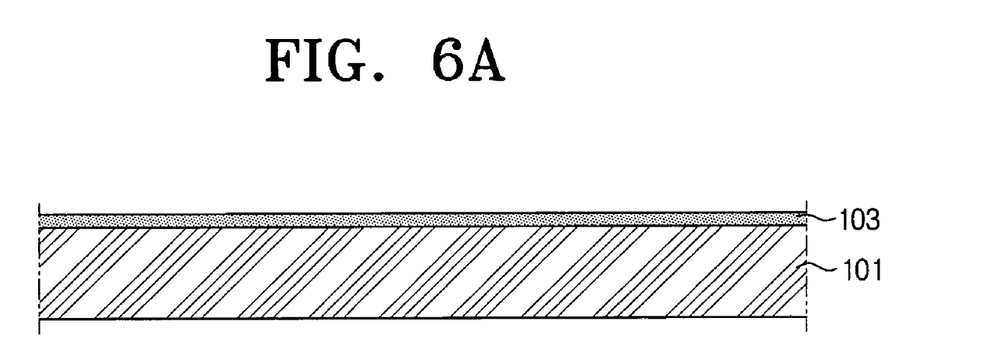
FIG. 6A to FIG. 6D illustrate a method of fabricating a band filter using a film acoustic resonator in accordance with an exemplary embodiment of the present invention.
Figure 6B:
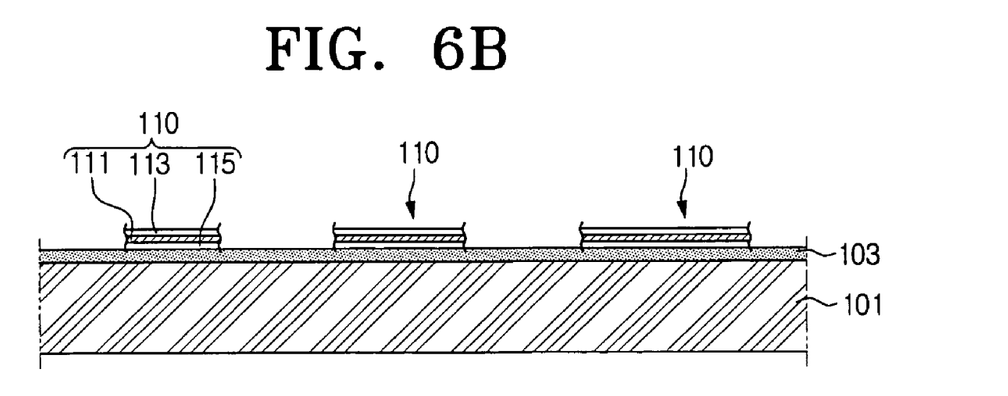
Figure 6C:
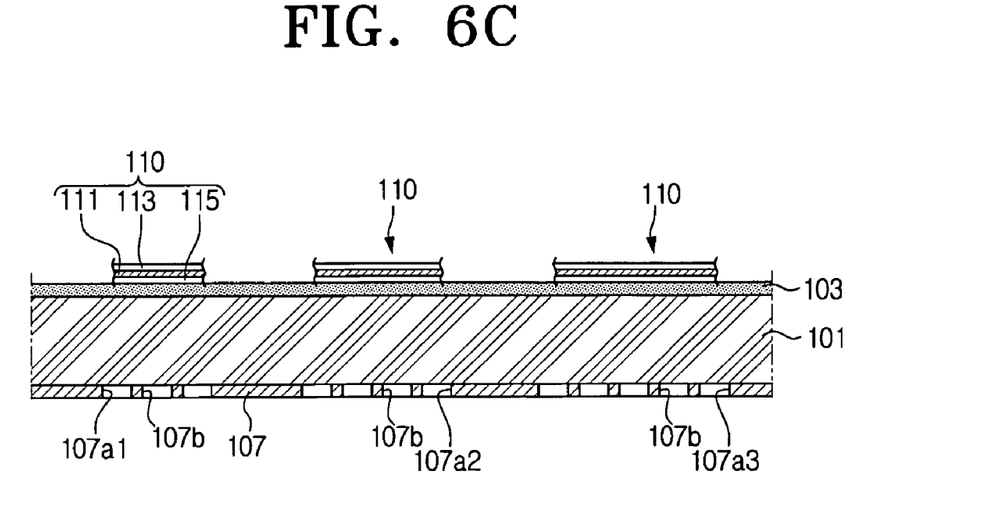
Figure 6D:
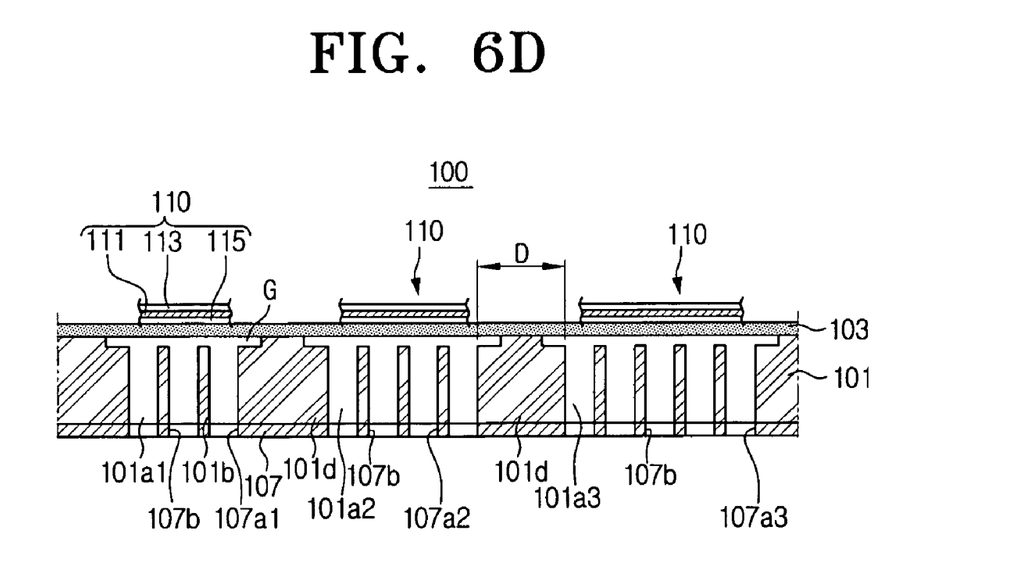
Figure 7A:
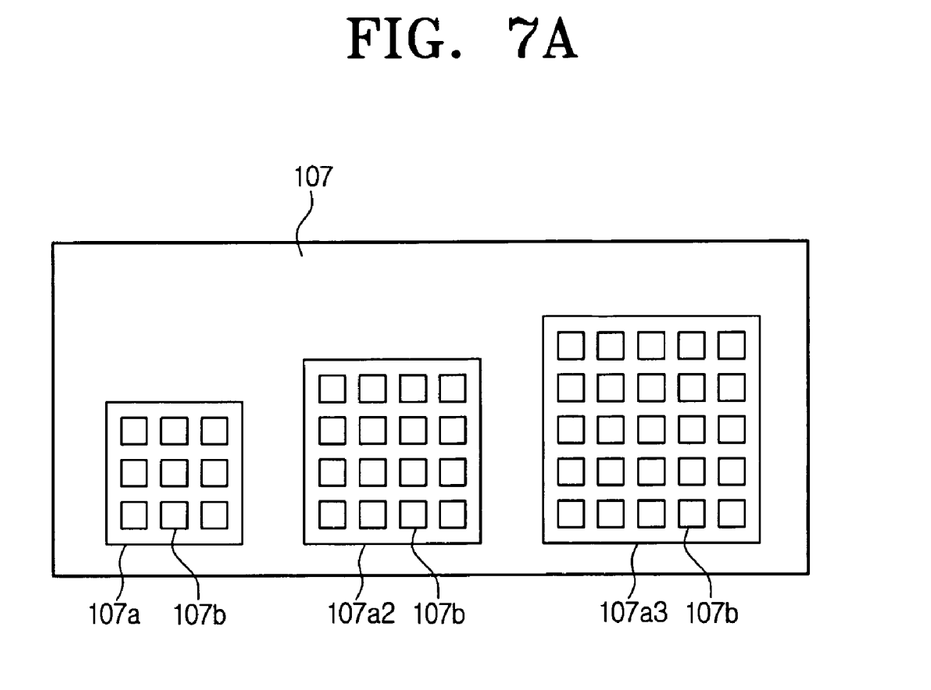
FIG. 7A to FIG. 7C are plane views showing mask layer patterns used in a method of fabricating a bank filter in accordance with an exemplary embodiment of the present invention.
Figure 7B:
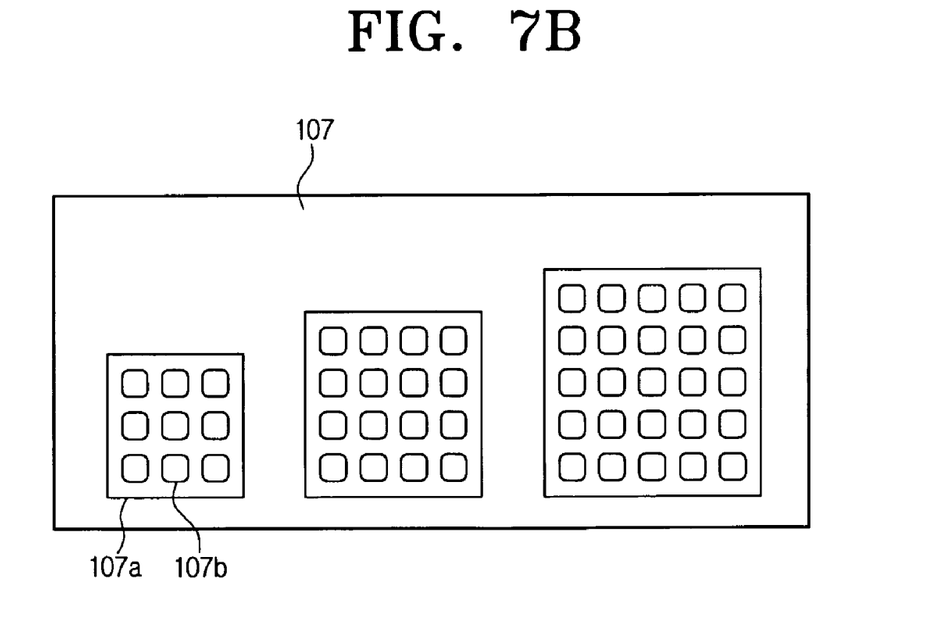
Figure 7C:
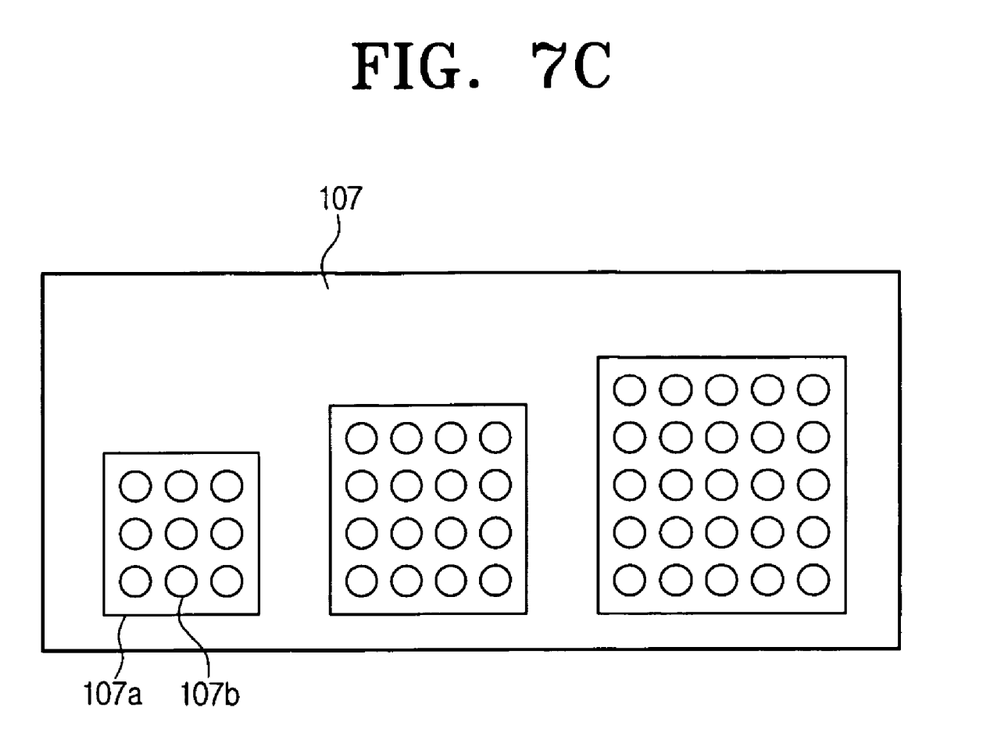

FIG. 6A to FIG. 6D illustrates a method of fabricating a band filter in accordance with an exemplary embodiment of the present invention, and FIG. 7A to FIG. 7C illustrate mask layers with sub windows in accordance with various examples, which are used in the method in accordance with embodiments of the present invention.

Referring to FIG. 6A, a substrate 101 is prepared and a membrane layer 103 is deposited with a certain thickness on the upper surface of the substrate 101. The substrate 101 is, for example, a silicon substrate and the membrane layer 103 supports resonators 110 to be able to vibrate and defines the etching depth of cavities $101_{a1}$, $101_{a2}$ and $101_{a3}$ discussed below. Accordingly, the membrane 103 is preferably formed of a protective material that will not be etched upon cavity etching.

The protective material is an $SiO_2$ layer or a metal layer. The silicon dioxide layer can be formed by oxidizing the surface of a silicon wafer with a thermal oxidation process and by a thin film deposition process. The thin film may be deposited with a chemical vapor deposition (CVD) process or a physical vapor deposition (PVD) process. The metal layer can be formed of a chrome Cr layer or an aluminum nitride AlN layer with the CVD or the PVD process.

Referring to FIG. 6B, the resonators 110 are formed on the membrane layer 103. For formation of the resonators 110, a lower electrode layer, a piezoelectric layer and an upper electrode layer, not shown, are formed sequentially, and patterned in order of the upper electrode layer, the piezoelectric layer and the lower electrode layer so as to form sequentially upper electrodes 113, piezoelectric layer patterns 111, and lower electrodes 115, thereby forming the resonators 110. The resonators 110 are connected via wires in series or in parallel with each other (wires not illustrated in the drawings).

Referring to FIG. 6C and FIG. 7A to FIG. 7C, a mask layer 107 is formed on the lower surface of the substrate 101 provided with the resonators 110, and patterned to form windows (main widows) $107_{a1}$, $107_{a2}$ and $107_{a3}$, which are used for forming cavities $101_{a1}$, $101_{a2}$ and $101_{a3}$, and sub windows $107_b$. The mask layer 107 is a silicon dioxide layer or a photoresist layer. In a case where the mask layer is a silicon oxide layer, the mask layer and the membrane layer can be simultaneously processed.

Sizes of the main windows $107_{a1}$, $107_{a2}$ and $107_{a3}$ are set to be different to make characteristics of the resonators 110 be different. The sub windows $107_b$ are formed in each main window $107_{a1}$, $107_{a2}$ and $107_{a3}$. Referring to FIG. 7A to FIG. 7C, the sub windows can be a rectangular, a corner-rounded rectangular or a circle. In consideration of a dry etching characteristic that an etching rate is lower at corners compared to the center of an object shape to be formed, it is preferable that the sub windows $107_b$ are circular or corner-rounded rectangular.

The sub windows $107_b$ are identical in a size to make the etching condition be identical for every window even if the sizes of the cavities $101_{a1}$, $101_{a2}$ and $101_{a3}$ are different. That is, even if the cavities $101_{a1}$, $101_{a2}$ and $101_{a3}$ have different sizes, inside of the cavities $101_{a1}$, $101_{a2}$ and $101_{a3}$ are etched through the sub windows $107b$ with the same size so that etching condition for each cavity becomes the same.

Referring to FIG. 6D, the substrate 101 is etched along the mask patterns described above using an ICP etching equipment, thereby forming the cavities $101a$ and sub walls $101_b$ in a net format. The sub walls $101_b$ have a gap between the membrane layer 103 due to the notch effect, that is, the sub walls $101_b$ are separated from the membrane layer 103 having an air gap G between both of them. The notch effect is discussed above but will be described in more detailed below.

First, in accordance with the principle of the dry etching, if electrical energy is applied to gas molecules in a vacuum chamber, valance electrons are pushed out of the outermost shell of the orbit of a molecule or an atom due to the collision of accelerated electrons, so that ions or radicals with high reactivity are produced. The ions and radicals are accelerated due to the continuous collision and van der Waals force and collided with the surface of a material, thereby breading a bond in molecules in several micrometers and cutting away the substrate in the sub windows $107_b$. Meanwhile, after the etching is progressed, the ions and radicals finally reach the membrane layer 103 and are reflected from the surface of the membrane layer 103 serving as a dielectric. At this time, some ions and radicals of the reflected ions and radicals are collided with the sub walls $107_b$, thereby etching away a portion of the sub walls $107_b$. Accordingly, the top of the sub walls $107_b$ are separated from the membrane layer 103 by a distance. The thickness of the sub walls 103 are determined so as for the top thereof to be completely separated from the membrane layer 103 considering the amount of notch effect.

As described above, it is possible to reduce a notch area by using the sub windows $107_b$. Accordingly, a distance D between cavities $101_{a1}$, $101_{a2}$ and $101_{a3}$ will be reduced. (See FIG. 5). Further, since the substrate is etched through the sub windows with the same size, etching condition for each cavity $101_{a1}$, $101_{a2}$ and $101_{a3}$ becomes the same so that the cavities $101_{a1}$, $101_{a2}$ and $101_{a3}$ with desired sizes can be formed even though the cavities $101_{a1}$, $101_{a2}$ and $101_{a3}$ are different in sizes and etched at the same time.

The foregoing embodiments are merely exemplary and are not to be construed as limiting the present invention. The present teaching can be readily applied to other types of exemplary embodiments. Also, the description of the exemplary embodiments of the present invention are intended to be illustrative, and not to limit the scope of the claims, and many alternatives, modifications, and variations will be apparent to those skilled in the art.

What is claimed is:

1. A method of fabricating a band filter using a film bulk acoustic resonator, comprising:

forming a membrane layer on an upper surface of a substrate;

forming a plurality of resonators on an upper surface of the membrane layer;

depositing a mask layer on a lower surface of the substrate and patterning the mask layer to form a plurality of main windows and sub windows; and forming cavities to penetrate through the substrate along the main windows and the sub windows in the substrate at positions corresponding to respective resonators and forming sub walls in the cavities in such a way that the sub walls are separated apart from the membrane layer, wherein each of the cavities has the sub walls arranged in a format.

2. The method according to claim 1, wherein the sub windows are rectangular, circular or corner-rounded rectangular.

3. The method according to claim 1, wherein the main windows are formed in different sizes and the sub windows are formed in identical sizes.

4. The method according to claim 1, wherein the substrate is a silicon substrate.

5. The method according to claim 1, wherein the format comprises a net format.

6. The method according to claim 1, wherein the sub walls are separated apart from the membrane layer by using a notch effect which is caused as ions generated during a dry etching process are reflected from the membrane layer and the reflected ions etch a portion of the sub walls.

7. The method according to claim 6, wherein a thickness of the sub walls is determined depending on an amount of etching caused by the reflected ions so as for the sub walls to be separated from the membrane layer.

8. The method according to claim 1, wherein the membrane layer is formed of a protective material which is not etched by dry etching.

9. The method according to claim 8, wherein the membrane layer is an oxide layer or a metal layer.

10. The method according to claim 1, wherein the mask layer is a photoresist layer or an oxide layer.

11. The method according claim 10, wherein the oxide layer is formed by a thermal oxidation process or a thin film deposition process.

12. The method according to claim 10, wherein the photoresist layer is formed by a spin coating process.

* * * * *